United States Patent
Dong et al.

(10) Patent No.: US 11,860,541 B2
(45) Date of Patent: Jan. 2, 2024

(54) SILICON-BASED NANOWIRE, PREPARATION METHOD THEREOF, AND THIN FILM TRANSISTOR

(71) Applicant: BOE Technology Group Co., Ltd., Beijing (CN)

(72) Inventors: Xue Dong, Beijing (CN); Guangcai Yuan, Beijing (CN); Feng Guan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 663 days.

(21) Appl. No.: 17/048,301

(22) PCT Filed: Mar. 25, 2020

(86) PCT No.: PCT/CN2020/081170
§ 371 (c)(1),
(2) Date: Oct. 16, 2020

(87) PCT Pub. No.: WO2020/224347
PCT Pub. Date: Nov. 12, 2020

(65) Prior Publication Data
US 2021/0240080 A1  Aug. 5, 2021

(30) Foreign Application Priority Data
May 8, 2019  (CN) .......................... 201910381377.9

(51) Int. Cl.
*H01L 27/32* (2006.01)
*H01L 51/50* (2006.01)
(Continued)

(52) U.S. Cl.
CPC ............ *G03F 7/075* (2013.01); *G03F 7/0002* (2013.01); *G03F 7/0047* (2013.01); *G03F 7/11* (2013.01);
(Continued)

(58) Field of Classification Search
CPC ......... H01L 21/02645; H01L 21/02603; H01L 21/02532; H01L 21/02667; H01L 27/127;
(Continued)

(56) References Cited

U.S. PATENT DOCUMENTS 7,704,806 B2 * 4/2010 Chae ................. H01L 29/78696
 438/149
8,610,128 B2 * 12/2013 Chae .................... H01L 27/1222
 438/149
(Continued)

FOREIGN PATENT DOCUMENTS

CN  1745468 A  * 3/2006 ............. H01F 1/405
CN  101891145 A  * 11/2010 ............. B01J 21/02
(Continued)

OTHER PUBLICATIONS

Machine translation, Saito, WIPO Pat. Pub. No. WO2006/070670, translation date: Jul. 18, 2023, Clarivate Analytics, all pages. (Year: 2023).*

(Continued)

*Primary Examiner* — Victoria K. Hall
(74) *Attorney, Agent, or Firm* — IPro, PLLC

(57) ABSTRACT

The present disclosure discloses a silicon-based nanowire, a preparation method thereof, and a thin film transistor. By using a eutectic point of catalyst particles and silicon, and a driving factor that the Gibbs free energy of amorphous silicon is greater than that of crystalline silicon, and due to absorption of the amorphous silicon by the molten catalyst particles to form a supersaturated silicon eutectoid, the silicon nucleates and grows into silicon-based nanowires. Moreover, during the growth of the silicon-based nanowire, the amorphous silicon film grows linearly along guide slots under the action of the catalyst particles, and reverse growth of the silicon-based nanowire is restricted by the retaining walls, thus obtaining silicon-based nanowires with a high (Continued)

density and high uniformity. Furthermore, by controlling the size of the catalyst particles and the thickness of the amorphous silicon film, the width of the silicon-based nanowire may also be controlled.

18 Claims, 13 Drawing Sheets

(51) Int. Cl.
| | |
|---|---|
| *H01L 51/56* | (2006.01) |
| *G03F 7/075* | (2006.01) |
| *G03F 7/00* | (2006.01) |
| *G03F 7/004* | (2006.01) |
| *G03F 7/11* | (2006.01) |
| *H01L 29/06* | (2006.01) |
| *H01L 29/786* | (2006.01) |
| *B82Y 30/00* | (2011.01) |
| *B82Y 40/00* | (2011.01) |
| *C01B 33/021* | (2006.01) |

(52) U.S. Cl.
CPC .... *H01L 29/0669* (2013.01); *H01L 29/78651* (2013.01); *H01L 29/78696* (2013.01); *B82Y 30/00* (2013.01); *B82Y 40/00* (2013.01); *C01B 33/021* (2013.01); *C01P 2004/16* (2013.01)

(58) Field of Classification Search
CPC ............. H01L 27/1277; H01L 27/1281; H01L 29/2669; H01L 29/0673; H01L 29/78696; C01P 2004/16; B82Y 30/00; B82Y 40/00
See application file for complete search history.

(56) References Cited

U.S. PATENT DOCUMENTS

| | | | | |
|---|---|---|---|---|
| 2006/0226424 A1* | 10/2006 | Chae | ................. | H01L 29/41733 257/E29.151 |
| 2006/0231957 A1* | 10/2006 | Kim | ................. | H01L 29/42392 257/E27.111 |
| 2006/0261409 A1* | 11/2006 | Cho | ................. | H01L 29/78696 257/E21.415 |
| 2008/0303029 A1* | 12/2008 | Kawashima | ...... | H01L 29/78696 257/E29.245 |
| 2010/0163850 A1* | 7/2010 | Chae | ................... | H01L 29/0673 977/762 |
| 2011/0073837 A1* | 3/2011 | Zhou | ................... | H01L 29/0665 438/34 |
| 2012/0321785 A1* | 12/2012 | Rogers | .................. | C01B 32/162 427/249.1 |
| 2013/0228750 A1* | 9/2013 | Chae | ................. | H01L 29/66757 257/24 |
| 2017/0040465 A1* | 2/2017 | Yang | .................... | H01L 29/7843 |
| 2020/0150502 A1* | 5/2020 | Xu | ....................... | H01L 27/1259 |

FOREIGN PATENT DOCUMENTS

| | | | | |
|---|---|---|---|---|
| CN | 107086180 A | * | 8/2017 | ......... H01L 29/6675 |
| CN | 108217591 A | * | 6/2018 | ........... B82B 3/0014 |
| WO | WO-2006070670 A1 | * | 7/2006 | ......... H01L 29/0665 |

OTHER PUBLICATIONS

Machine translation, Duan, Chinese Pat. Pub. No. CN-1745468-A, translation date: Jul. 18, 2023, Clarivate Analytics, all pages. (Year: 2023).*
Machine translation, Yu, Chinese Pat. Pub. No. CN-108217591-A, translation date: Jul. 17, 2023, Espacenet, all pages. (Year: 2023).*
Machine translation, Yu, Chinese Pat. Pub. No. CN-107086180-A, translation date: Jul. 17, 2023, Espacenet, all pages. (Year: 2023).*
Machine translation, Zhanghong, Chinese Pat. Pub. No. CN-101891145-A, translation date: Jul. 17, 2023, Espacenet, all pages. (Year: 2023).*
L. Yu et al., In-Plane Epitaxial Growth of Silicon Nanowires and Junction Formation on Si(100) Substrates, published Oct. 24, 2014, Nano Letters, vol. 14, pp. 6469-6474. (Year: 2014).*
X. Duan et al., High-performance thin-film transistors using semiconductor nanowires and nanoribbons, Sep. 18, 2003, Nature, vol. 425, pp. 274-278 (Year: 2003).*
International Searching Authority, Written Opinion of International Searching Authority, International application No. PCT/CN2020/081170, dated Jun. 30, 2020, all pages. (Year: 2020).*
International Searching Authority, International Search Report, International application No. PCT/CN2020/081170, dated Jun. 30, 2020, all pages. (Year: 2020).*

* cited by examiner

SILICON-BASED NANOWIRE, PREPARATION METHOD THEREOF, AND THIN FILM TRANSISTOR

CROSS REFERENCE TO RELATED APPLICATIONS

The present disclosure is a national phase entry under 35 U.S.C. § 371 of International Application No. PCT/CN2020/081170, filed on Mar. 25, 2020, which claims priority to Chinese Patent Application No. 201910381377.9 filed with the China National Intellectual Property Administration (CNIPA) on May 8, 2019 and entitled 'Silicon-Based Nanowire, Preparation Method Thereof, and Thin Film Transistor', the entire contents of which are incorporated herein by reference.

FIELD

The present disclosure relates to the field of semiconductor technology, in particular to a silicon-based nanowire, a preparation method thereof, and a thin film transistor.

BACKGROUND

Silicon-based nanowires are a new type of silicon-based semiconductor material developed in recent years, and have a one-dimensional size structure and more excellent semiconductor characteristics. The use of silicon-based nanowire as thin film transistor channels can achieve higher mobility and more stable characteristics.

The use of silicon-based nanowires as channel materials for thin-film transistor is particularly important for size uniformity and controllability. Therefore, to meet the uniformity requirement of display devices, how to obtain a silicon-based nanowire with a uniform and controllable size has become a hot research topic.

SUMMARY

A method for preparing a silicon-based nanowire provided by an embodiment of the present disclosure includes: forming catalyst particles, guide walls and retaining walls on a base substrate, where the guide walls extend in a first direction; the retaining walls and the guide walls intersect and are located in a same layer; and the catalyst particles are located in areas defined by the retaining walls and the guide walls, and have a eutectic point with silicon; forming an amorphous silicon film covering the catalyst particles, the guide walls and the retaining walls; and forming the silicon-based nanowires by annealing the amorphous silicon film to a growth of the amorphous silicon from the catalyst particles and along the first direction.

Optionally, in the preparation method provided by the embodiment of the present disclosure, the forming catalyst particles, guide walls and retaining walls on a base substrate includes: forming a dielectric layer on the base substrate; forming a pattern of the guide walls and a pattern of the retaining walls by patterning the dielectric layer; forming a catalyst film layer on the base substrate formed with the pattern of the guide walls and the retaining walls; and forming a pattern of the catalyst particles in the catalyst film layer.

Optionally, in the preparation method provided by the embodiment of the present disclosure, the forming catalyst particles, guide walls and retaining walls on a base substrate includes: forming a catalyst film layer on the base substrate; forming a pattern of the catalyst particles in the catalyst film layer; forming a dielectric layer on the base substrate formed with the pattern of the catalyst particles; and forming a pattern of the guide walls and a pattern of the retaining walls by patterning the dielectric layer.

Optionally, in the preparation method provided by the embodiment of the present disclosure, the forming a pattern of the catalyst particles in the catalyst film layer includes: forming an imprint resist on the catalyst film layer; forming a pattern of imprint resist particles by a nanoimprint process on the imprint resist; and forming the pattern of the catalyst particles by etching the catalyst film layer with the pattern of the imprint resist particles as a mask pattern.

Optionally, in the preparation method provided by the embodiment of the present disclosure, the forming a pattern of the catalyst particles in the catalyst film layer includes: forming an imprint resist on the catalyst film layer; forming a pattern of imprint resist lines by a nanoimprint process on the imprint resist, where an extending direction of the imprint resist lines equals to an extending direction of the retaining walls; form a pattern of catalyst lines by etching the catalyst film layer with the pattern of the imprint resist lines as a mask pattern; and forming the pattern of the catalyst particles by plasma bombardment on the catalyst lines.

Optionally, in the preparation method provided by the embodiment of the present disclosure, a width of a catalyst line is in a range from 50 nm to 1000 nm.

Optionally, in the preparation method provided by the embodiment of the present disclosure, the forming a pattern of the catalyst particles in the catalyst film layer specifically includes: forming a photoresist on the catalyst film layer; forming a pattern of photoresist particles by an exposure and developing process of the photoresist; and forming the pattern of the catalyst particles by etching the catalyst film layer with the pattern of the photoresist particles as a mask pattern.

Optionally, in the preparation method provided by the embodiment of the present disclosure, a material of the catalyst particles is indium, tin, nickel, or indium oxide.

Optionally, in the preparation method provided by the embodiment of the present disclosure, heights of the guide walls and heights of the retaining walls are greater than or equal to particle diameters of the catalyst particles.

Optionally, in the preparation method provided by the embodiment of the present disclosure, particle diameters of the catalyst particles are in a range from 1 nm to 5000 nm.

Optionally, in the preparation method provided by the embodiment of the present disclosure, heights of the guide walls are in a range from 5 nm to 5000 nm, and heights of the retaining walls are in a range from 5 nm to 5000 nm.

Optionally, in the preparation method provided by the embodiment of the present disclosure, the eutectic point of the catalyst particles and silicon is within a temperature range from 200° C. to 1000° C.; and an annealing temperature is in a range from 200° C. to 600° C. in the annealing of the amorphous silicon film.

Optionally, in the preparation method provided by the embodiment of the present disclosure, the catalyst particles are formed close to the retaining walls.

Optionally, in the preparation method provided by the embodiment of the present disclosure, within an area defined by the retaining walls and the guide walls, the catalyst particles are in contact with a same retaining wall, and at least part of the catalyst particles is in contact with at least one guide wall.

Optionally, in the preparation method provided by the embodiment of the present disclosure, within each area defined by the retaining walls and the guide walls, one or more catalyst particles are formed.

Correspondingly, an embodiment of the present disclosure further provides a silicon-based nanowire, which is prepared by any of the above-mentioned preparation methods provided by embodiments of the present disclosure.

Correspondingly, an embodiment of the present disclosure further provides a thin film transistor, which includes a source, a drain, a gate and an active layer, where the material of material of the active layer is the above-mentioned silicon-based nanowire provided by an embodiment of the present disclosure.

DETAILED DESCRIPTION OF THE EMBODIMENTS

Figure 1A:
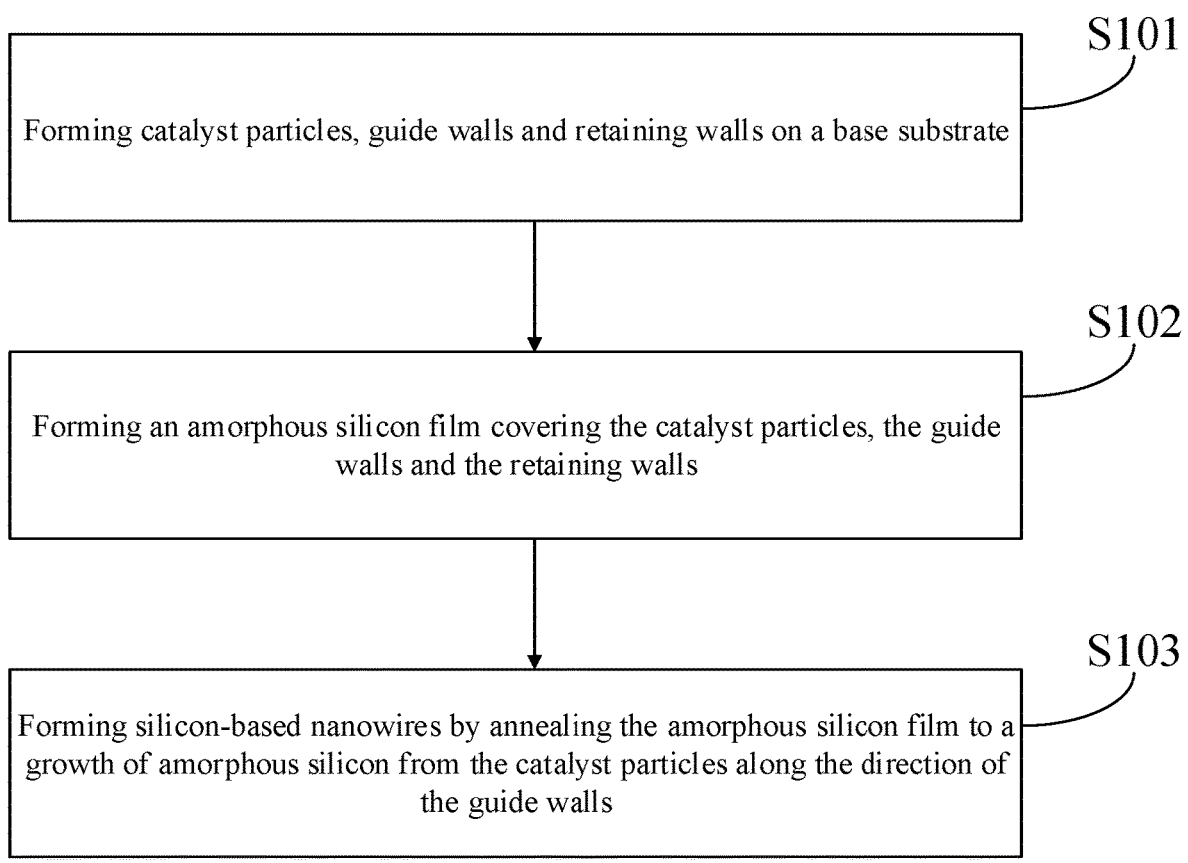
FIG. 1 is a flow diagram of a preparation method of a silicon-based nanowire provided by an embodiment of the present disclosure.
Figure 1B:
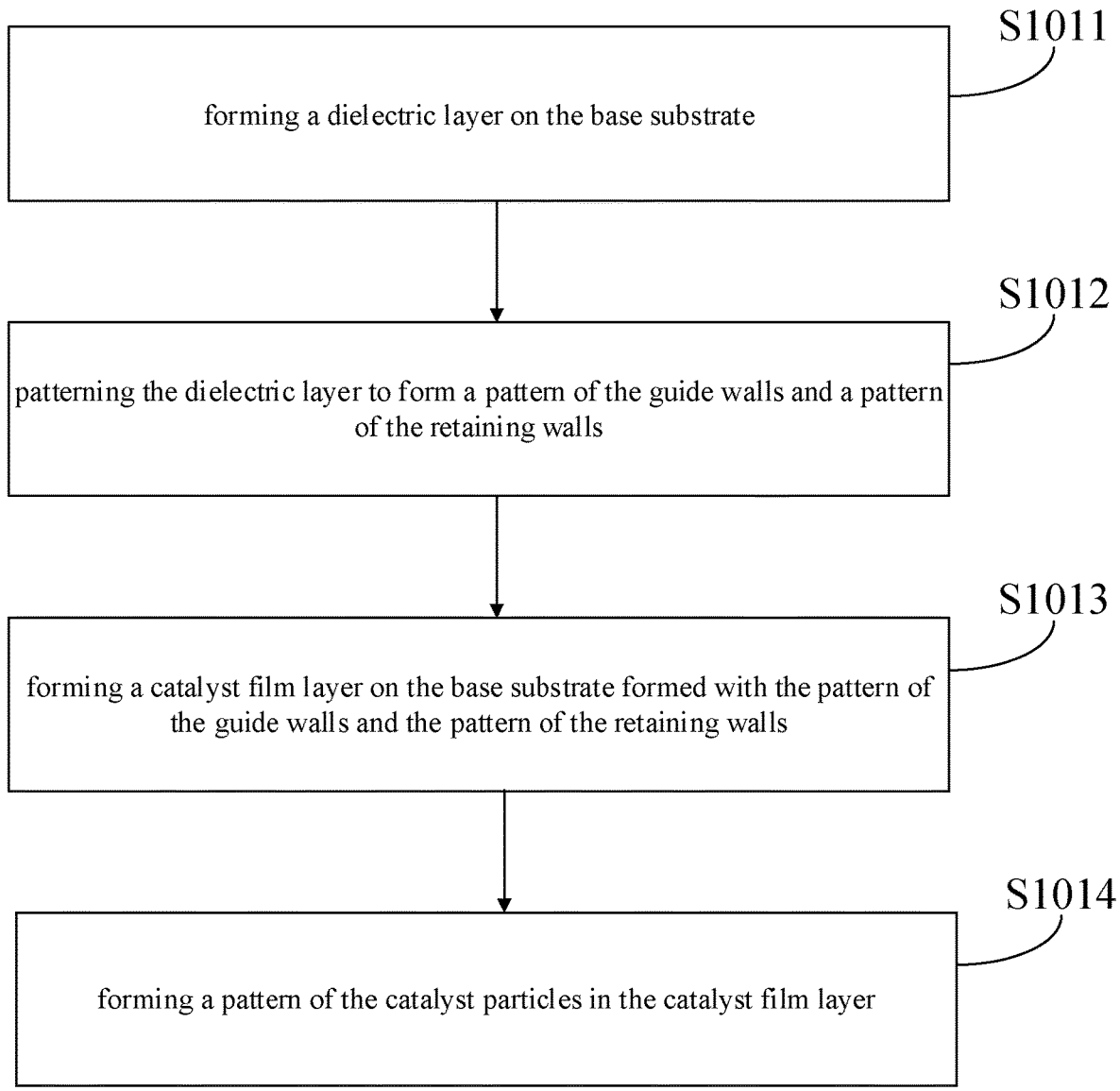
Figure 1C:
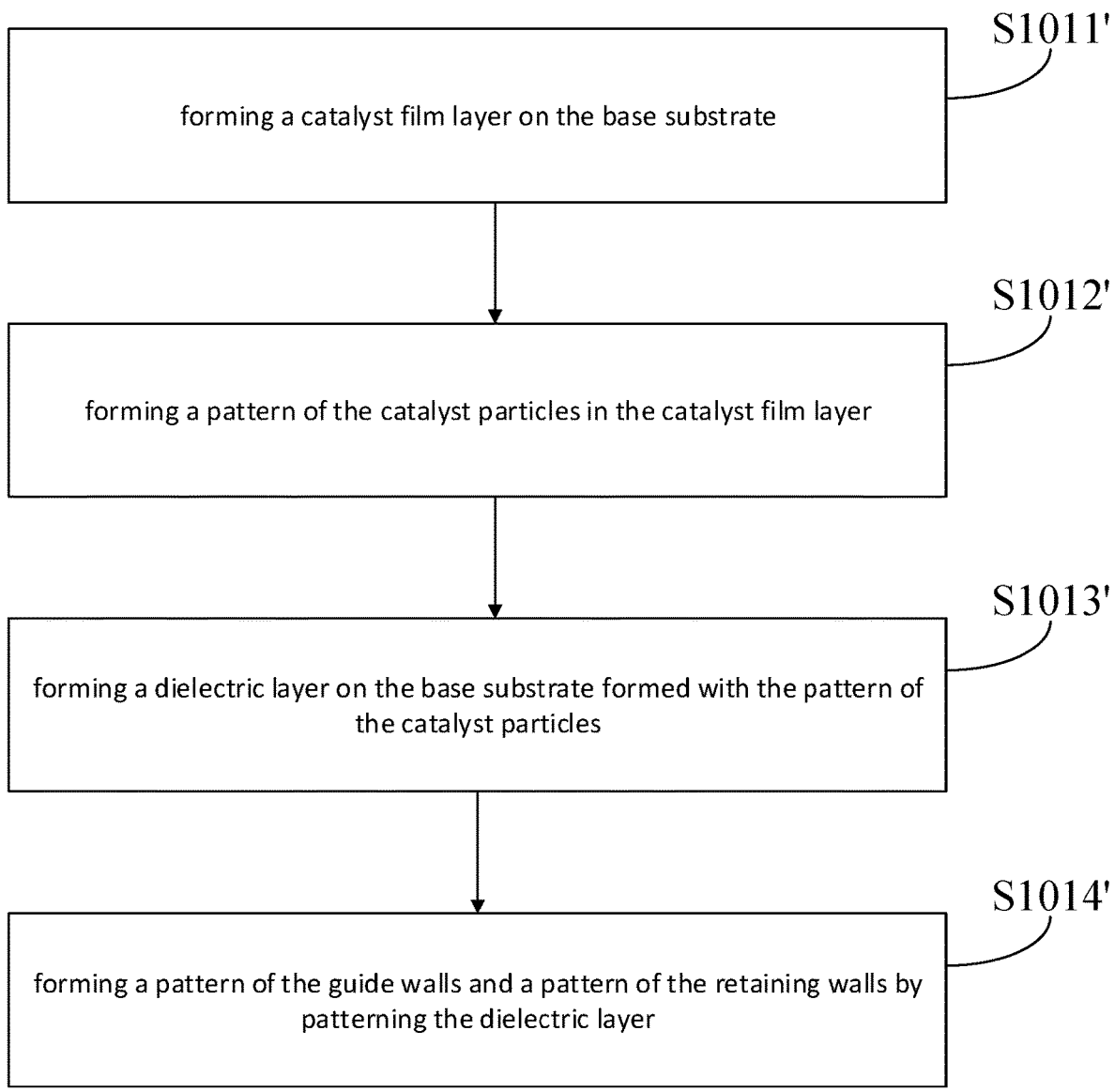
Figure 1D:
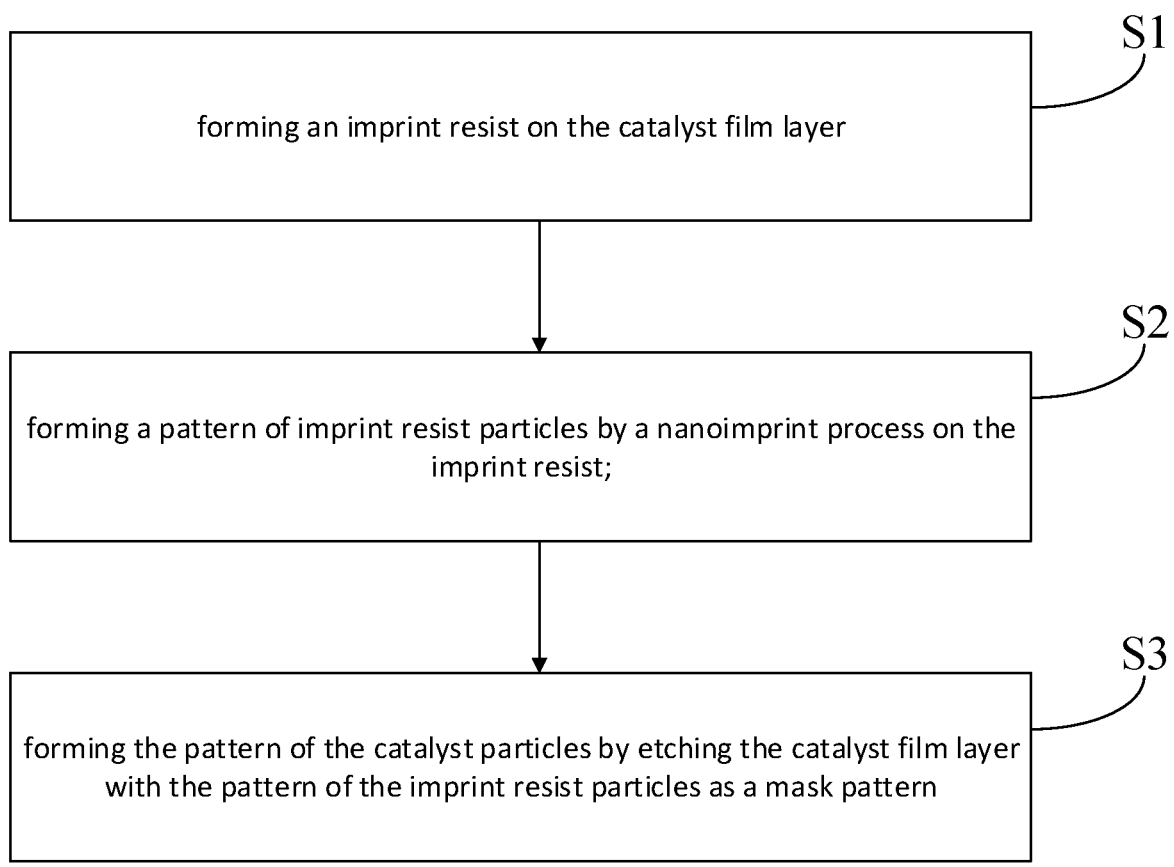
Figure 1E:
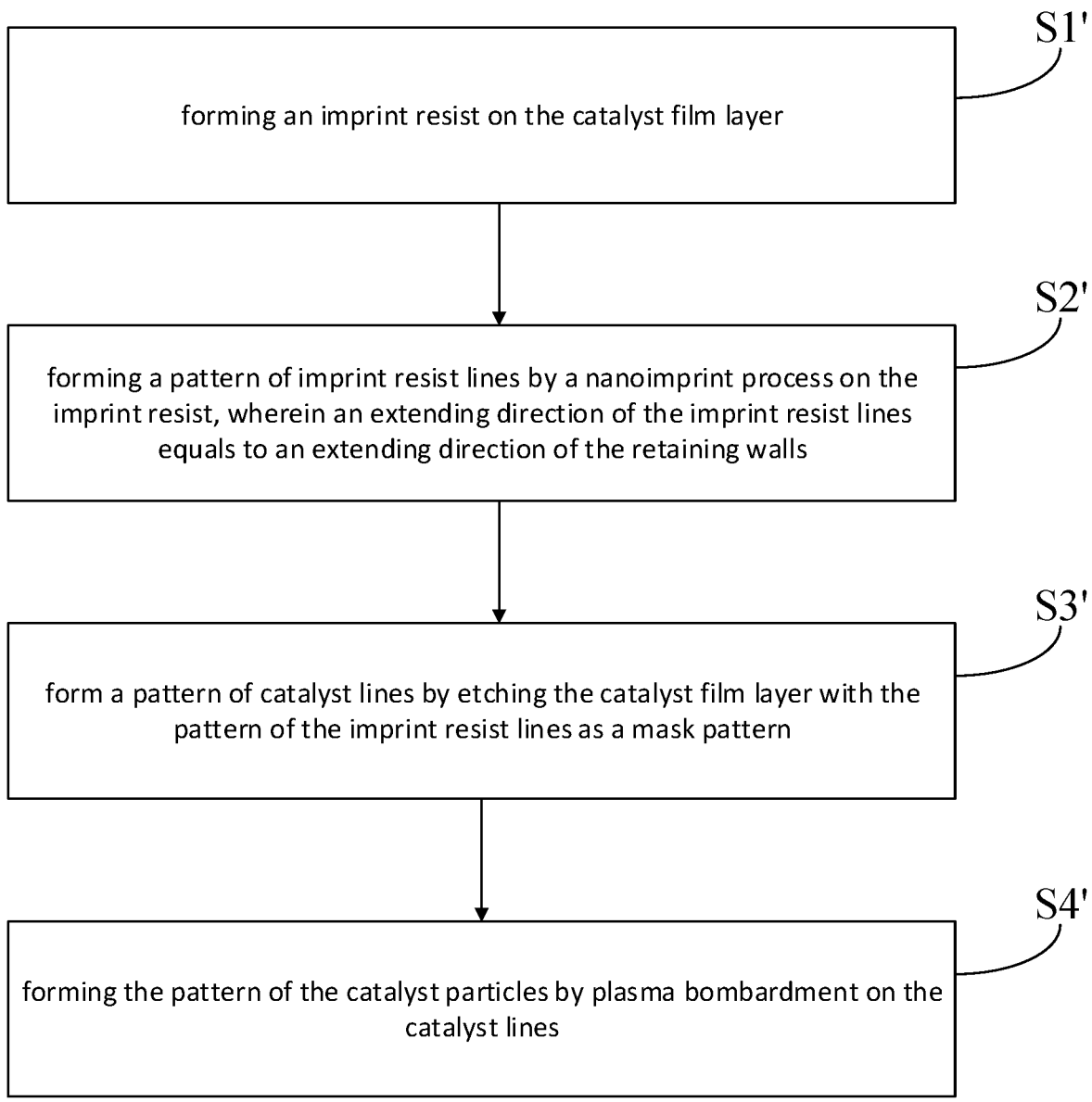
Figure 1F:
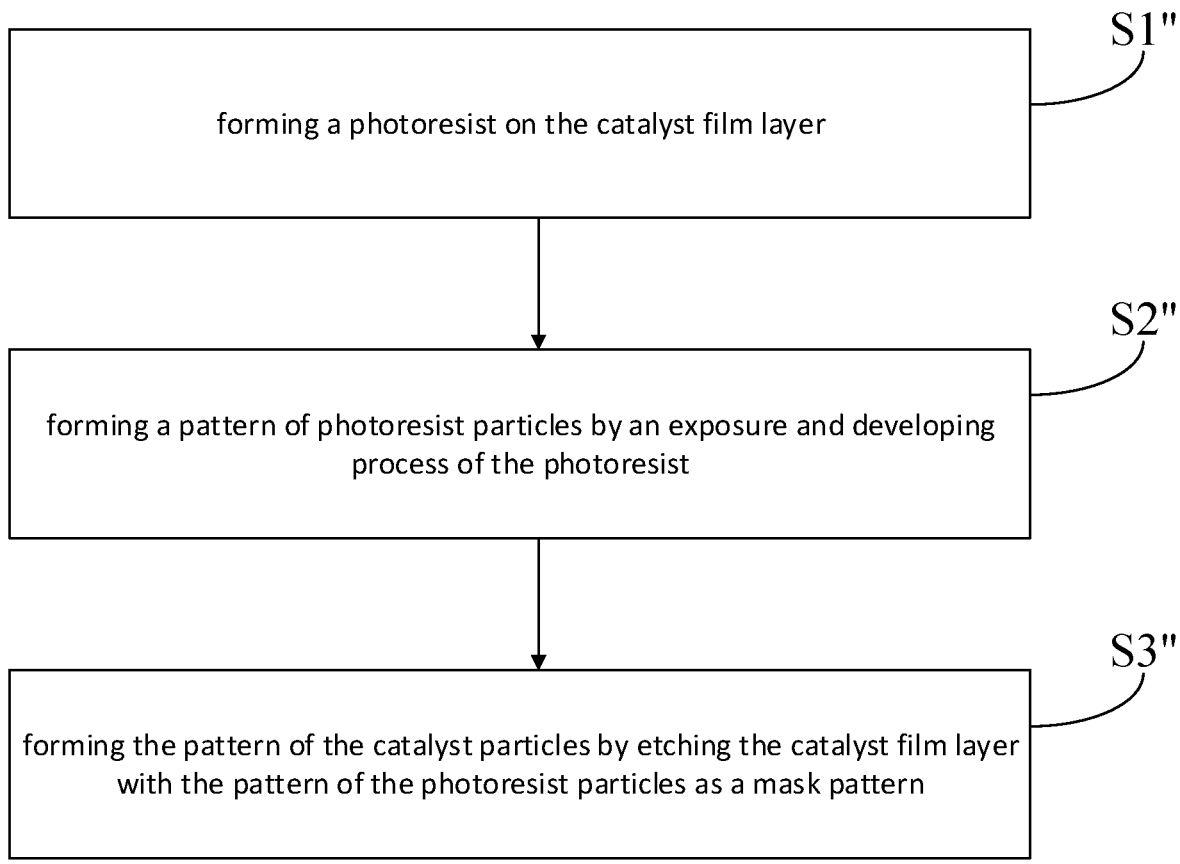

Embodiments of the present disclosure provide a silicon-based nanowire, a method for preparing the silicon-based nanowire, and a thin film transistor. To make the objects, technical solutions and advantages of the present disclosure clearer, the present disclosure will be further described in detail below in conjunction with the accompanying drawings. Apparently, the embodiments described are part of, rather than all of, the embodiments of the present disclosure. Based on the embodiments of the present disclosure, all other embodiments obtained by those of ordinary skill in the art without creative work shall fall within the protection scope of the present disclosure.

The shapes and sizes of the components in the drawings do not reflect the true scale, and are merely intended to illustrate the present disclosure.

An embodiment of the present disclosure provides a method for preparing a silicon-based nanowire, as shown in FIG. 1, including the following.

S101, forming catalyst particles, guide walls and retaining walls on a base substrate. The guide walls extend in a first direction. The retaining walls and the guide walls intersect and are located in a same layer. The catalyst particles are located in areas defined by the retaining walls and the guide walls, and the catalyst particles have a eutectic point with silicon;

S102, forming an amorphous silicon film covering the catalyst particles, the guide walls and the retaining walls.

S103, forming silicon-based nanowires by annealing the amorphous silicon film to a growth of amorphous silicon from the catalyst particles along the direction of the guide walls.

In the preparation method provided by the embodiment of the present disclosure, by using a eutectic point of the catalyst particles and silicon, and a driving factor that the Gibbs free energy of amorphous silicon is greater than that of crystalline silicon (silicon-based nanowire), and due to absorption of the amorphous silicon by the molten catalyst particles to form a supersaturated silicon eutectoid, the silicon nucleates and grows into silicon-based nanowires. Moreover, during the growth of the silicon-based nanowire, the amorphous silicon film grows linearly along guide walls under the action of the catalyst particles, and reverse growth of the silicon-based nanowire is restricted by the retaining walls, thus obtaining silicon-based nanowires with a high density and high uniformity. Furthermore, by controlling the size of the catalyst particles and the thickness of the amorphous silicon film, the width of the silicon-based nanowire may also be controlled.

Optionally, in the preparation method provided by the embodiment of the present disclosure, the eutectic point of the catalyst particles and silicon is generally within a temperature range from 200° C. to 1000° C. In annealing of the amorphous silicon film, an annealing temperature may be controlled between 200° C. and 600° C., such as 200° C., 300° C., 500° C., or 600° C., which is not limited here.

In specific implementation, in the preparation method provided by the embodiment of the present disclosure, before the formation of the amorphous silicon film, the catalyst particles may be formed before the guide walls and the retaining walls are formed; of course, the retaining walls and the guide walls may also be formed before the catalyst particles are formed, which is not limited here. Moreover, the finally formed retaining walls and guide walls being in a same layer means that in a same plane parallel to the base substrate, the guide walls and the retaining walls are not limited to be only in a same film layer. Specifically, the guide walls and the retaining walls may be formed in a same film layer, and may also be formed in adjacent two film layers, which is not limited here.

Optionally, in the preparation method provided by the embodiment of the present disclosure, catalyst particles, guide walls and retaining walls are formed on a base substrate by:

forming a dielectric layer on the base substrate;
patterning the dielectric layer to form a pattern of the guide walls and a pattern of the retaining walls;
forming a catalyst film layer on the base substrate formed with the pattern of the guide walls and the pattern of the retaining walls; and
forming a pattern of the catalyst particles in the catalyst film layer.

Or optionally, in the preparation method provided by the embodiment of the present disclosure, catalyst particles, guide walls and retaining walls are formed on a base substrate by:

forming a catalyst film layer on the base substrate;
forming a pattern of the catalyst particles in the catalyst film layer;
forming a dielectric layer on the base substrate formed with the pattern of the catalyst particles; and
patterning the dielectric layer to form a pattern of the guide walls and a pattern of the retaining walls.

In specific implementation, in the case where the catalyst particles are formed before the guide walls and the retaining walls are formed, in the process of patterning the dielectric layer to form a pattern of the guide walls and a pattern of the retaining walls, the dielectric layer in the areas defined by the guide walls and the retaining walls need to be removed to expose the catalyst particles, and the requirement on process accuracy is relatively high. Therefore, in the preparation method provided by the embodiment of the present disclosure, forming the retaining walls and the guide walls before the catalyst particles are formed is technically relatively easy to achieve.

In specific implementation, in the preparation method provided by the embodiment of the present disclosure, the dielectric layer may be formed by a layered deposition process, which is not limited herein.

Optionally, in the preparation method provided by the embodiment of the present disclosure, a pattern of the catalyst particles is formed in the catalyst film layer by:
forming an imprint resist on the catalyst film layer;
performing a nanoimprint process on the imprint resist to form a pattern of imprint resist particles; and
etching the catalyst film layer by using the pattern of the imprint resist particles as a mask pattern, to form the pattern of the catalyst particles.

In specific implementation, using a nanoimprint process to form the pattern of the catalyst particles can achieve high refineness of the pattern and ensure the uniformity and controllability of the catalyst particles, to ensure the uniform growth of silicon-based nanowire.

Optionally, in the preparation method provided by the embodiment of the present disclosure, a pattern of the catalyst particles is formed in the catalyst film layer by:
forming an imprint resist on the catalyst film layer;
performing a nanoimprint process on the imprint resist to form a pattern of imprint resist lines, where an extending direction of the imprint resist lines is the same as an extending direction of the retaining walls;
etching the catalyst film layer by using the pattern of the imprint resist lines as a mask pattern, to form a pattern of catalyst lines; and performing plasma bombardment on the catalyst lines to form the pattern of the catalyst particles.

Optionally, in the preparation method provided by the embodiment of the present disclosure, the catalyst line width may be controlled between 50 nm and 1000 nm, such as 50 nm, 100 nm, 500 nm, or 1000 nm, which is not limited here.

In specific implementation, the pattern of the catalyst particles may also be formed by a photolithography process. Therefore, optionally, in the preparation method provided by the embodiment of the present disclosure, a pattern of the catalyst particles is formed in the catalyst film layer by:
forming a photoresist on the catalyst film layer;
performing an exposure and developing process on the photoresist to form a pattern of photoresist particles; and
etching the catalyst film layer by using the pattern of the photoresist particles as a mask pattern, to form the pattern of the catalyst particles.

Optionally, in the preparation method provided by the embodiment of the present disclosure, the material of the catalyst particles may be indium, tin, nickel, or indium oxide, which is not limited here.

Optionally, in the preparation method provided by the embodiment of the present disclosure, the particle diameters of the catalyst particles may be controlled between 1 nm and 5000 nm, such as 1 nm, 10 nm, 50 nm, 100 nm, 500 nm, or 1000 nm, which is not limited here.

Optionally, in the preparation method provided by the embodiment of the present disclosure, the heights of the guide walls may be controlled between 5 nm and 5000 nm, such as 5 nm, 100 nm, 500 nm, or 1000 nm, which is not limited here.

Optionally, in the preparation method provided by the embodiment of the present disclosure, the heights of the retaining walls may be controlled between 5 nm and 5000 nm, such as 5 nm, 100 nm, 500 nm, or 1000 nm, which is not limited here.

In specific implementation, the particle diameter of the catalyst particle is determined according to the width of the silicon-based nanowire. Generally, the particle diameter of the catalyst particle is refinedness close to the width of the silicon-based nanowire. Further, the heights of the guide walls and the heights of the retaining walls are determined according to the particle diameters of the catalyst particles. Generally, the height of the guide wall and the height of the retaining wall are at least equal to the particle diameter of the catalyst particle. That is, the height of the guide wall and the height of the retaining wall are not less than the particle diameter of the catalyst particle. Moreover, in the case where the retaining wall and the guide wall are formed in a same film layer, their heights are generally equal.

Optionally, in the preparation method provided by the embodiment of the present disclosure, the catalyst particles are formed at positions close to the retaining walls. Generally, within ant area defined by the retaining walls and the guide walls, the catalyst particles are in contact with a same retaining wall, to ensure that within the areas defined by the retaining walls and the guide walls, the silicon-nanowire only grows toward one direction along the guide walls.

In specific implementation, in the preparation method provided by the embodiment of the present disclosure, within each area defined by the retaining walls and the guide walls, one or more catalyst particles are formed.

Optionally, in the preparation method provided by the embodiment of the present disclosure, if the distance between the two adjacent retaining walls is smaller than 1 μm, one catalyst particle is arranged in an area defined by the retaining walls and the guide walls.

In specific implementation, to ensure that each silicon-based nanowire can grow linearly along a set direction, at least one side of the catalyst particles is adjacent to the guide wall. That is, at least part of the catalyst particles is in contact with the guide wall. Therefore, within each area defined by the retaining walls and the guide walls, two catalyst particles may be arranged between adjacent two guide walls.

Of course, in specific implementation, within each area defined by the retaining walls and the guide walls, a plurality of catalyst particles may also be arranged such that a silicon-based nanowire grows along each catalyst particle.

It should be noted that in the preparation method provided by the embodiment of the present disclosure, the number of the guide walls may be determined according to the number of the silicon-based nanowires that are actually required. The positions of the retaining walls may be set according to the length of the required silicon-based nanowire, which is not limited here.

The preparation method provided by the embodiment of the present disclosure is described below with specific embodiments.

Some embodiments provided by the present disclosure specifically include as follows.

Figure 2A:
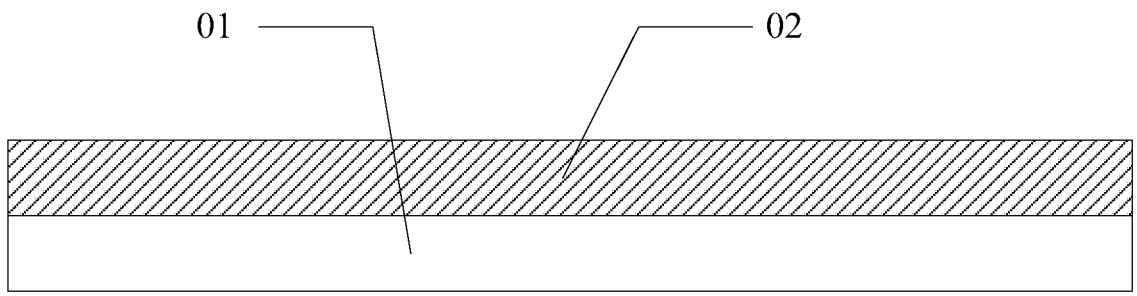
FIGS. 2A-2H are respective schematic diagrams of structures corresponding to a preparation method provided by an embodiment of the present disclosure after respective steps are executed.

Step 1, as shown in FIG. 2A, a dielectric layer 02 is formed on the base substrate 01. In specific implementation, the dielectric layer is formed by a layered deposition process, and the material of the dielectric layer may be AlOx, SiOx, or SiNx, which is not limited here.

Figure 2B:
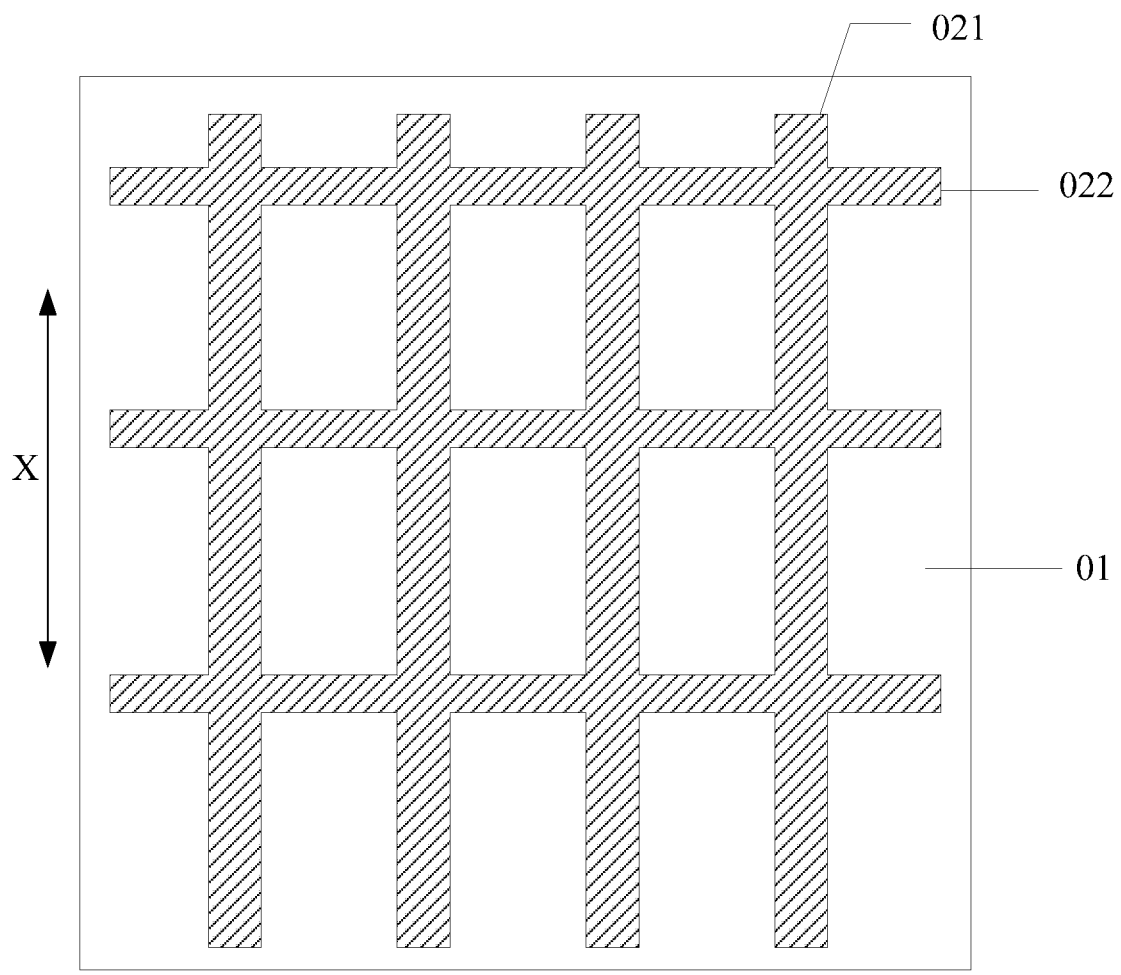

Step 2, as shown in FIG. 2B, the dielectric layer 02 is patterned, to form a pattern of guide walls 021 extending in a first direction X and a pattern of retaining walls 022 intersecting the guide walls 021 by one patterning process.

The included angles between the guide walls 021 and the retaining walls 022 may be nonzero acute angles or 90°.

In specific implementation, the heights of the guide walls and the heights of the retaining walls may be controlled between 5 nm and 5000 nm, which is not limited here.

Figure 2C:
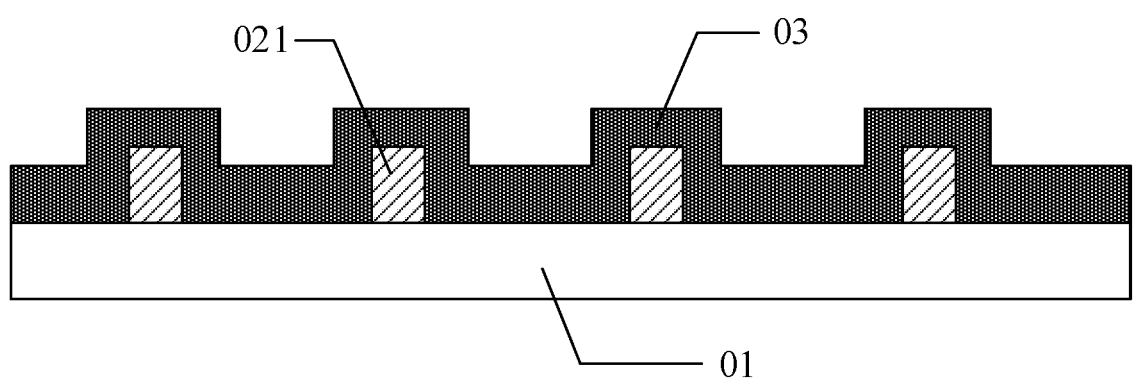

Step 3, as shown in FIG. 2C (the diagram is intended to show that the guide wall and retaining wall are located on the same level, but does not limit the height relationship between the guide wall and retaining wall), a catalyst film layer 03 covering the guide walls 021 and the retaining walls 022 is formed on the base substrate 01.

In specific implementation, the material of the catalyst film layer may be indium, tin, nickel, or indium oxide, which is not limited here.

Figure 2D:
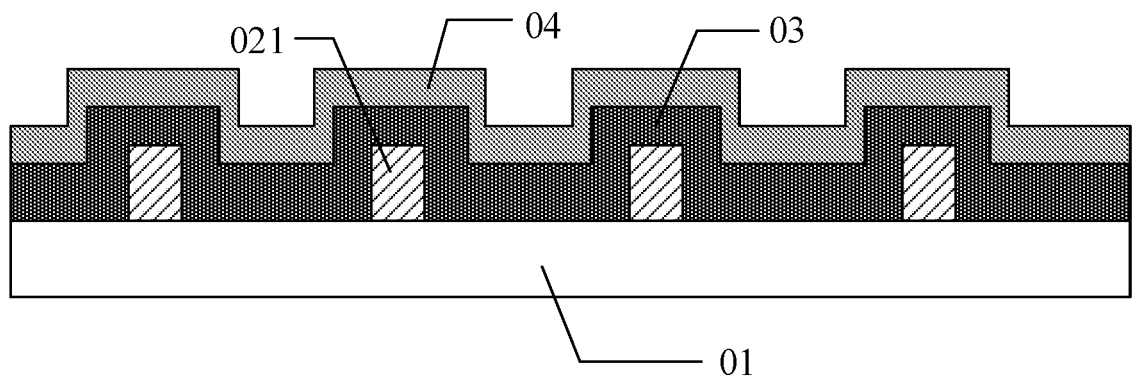

Step 4, as shown in FIG. 2D (the diagram is intended to show that the guide wall and retaining wall are located on the same level, but does not limit the height relationship between the guide wall and retaining wall), an imprint resist 04 is formed on the catalyst film layer 03.

Figure 2E:
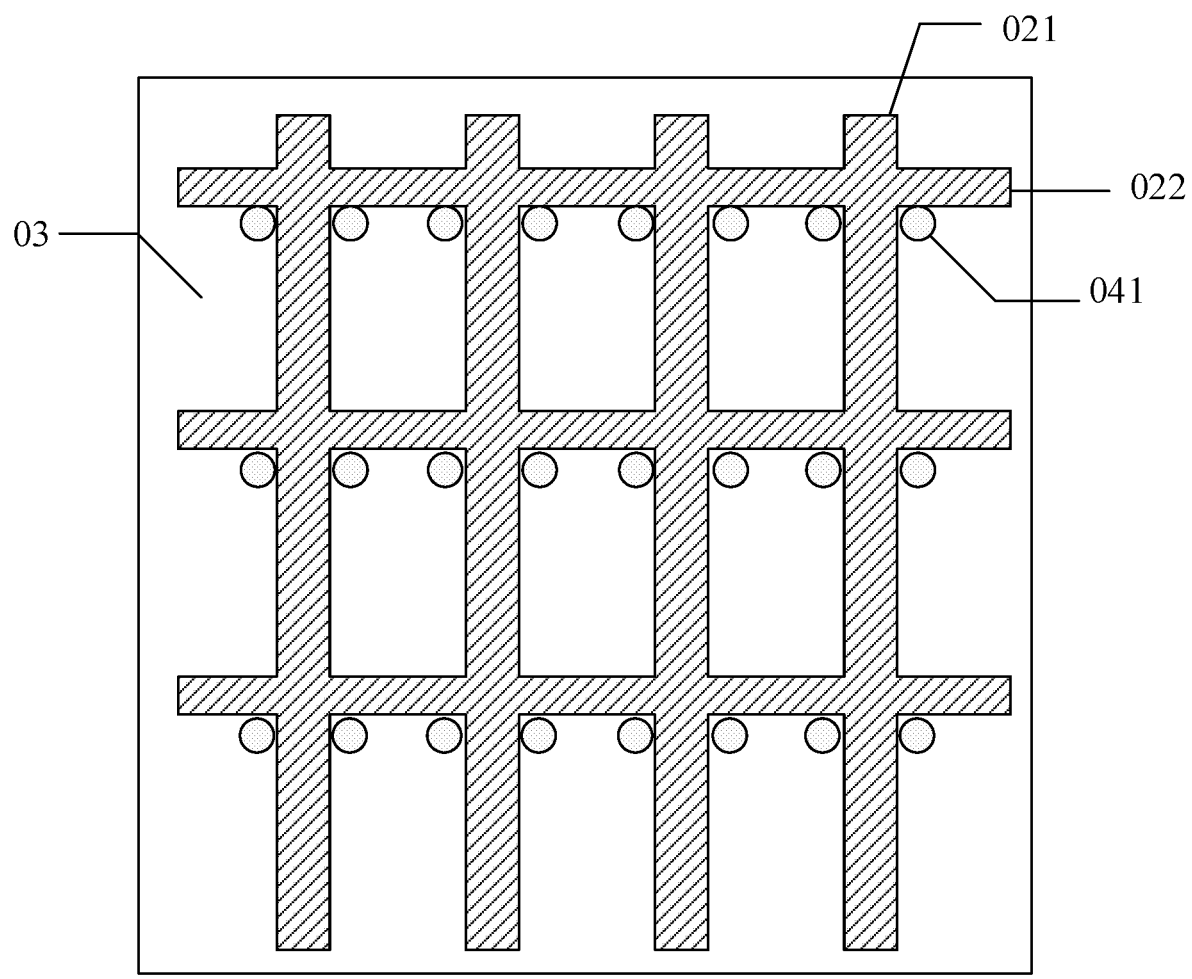

Step 5, as shown in FIG. 2E, a nanoimprint process is performed on the imprint resist 04 to form a pattern of imprint resist particles 041.

Figure 2F:
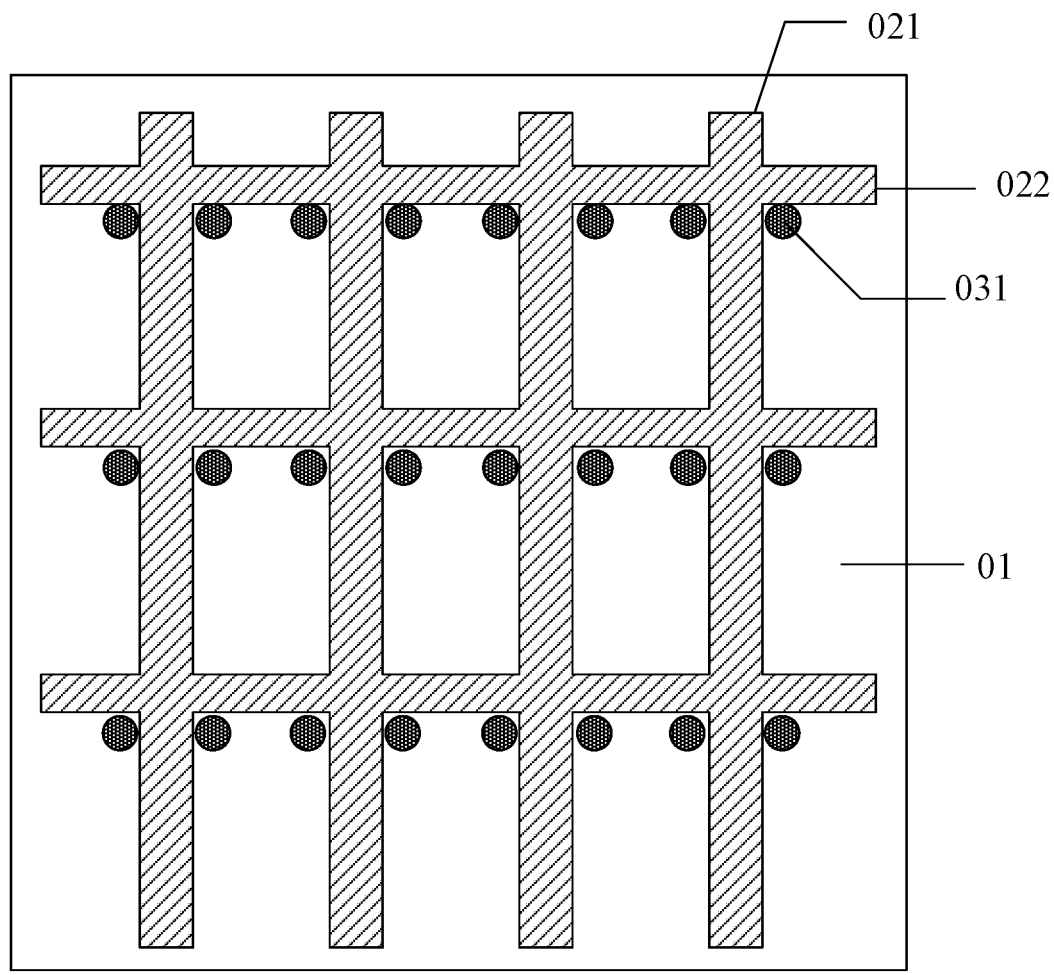

Step 6, as shown in FIG. 2F, the catalyst film layer 03 is etched by using the pattern of the imprint resist particles 041 as a mask pattern to form a pattern of catalyst particles 031.

In specific implementation, the particle diameters of the catalyst particles may be controlled between 1 nm and 5000 nm, which is not limited here.

Figure 2G:
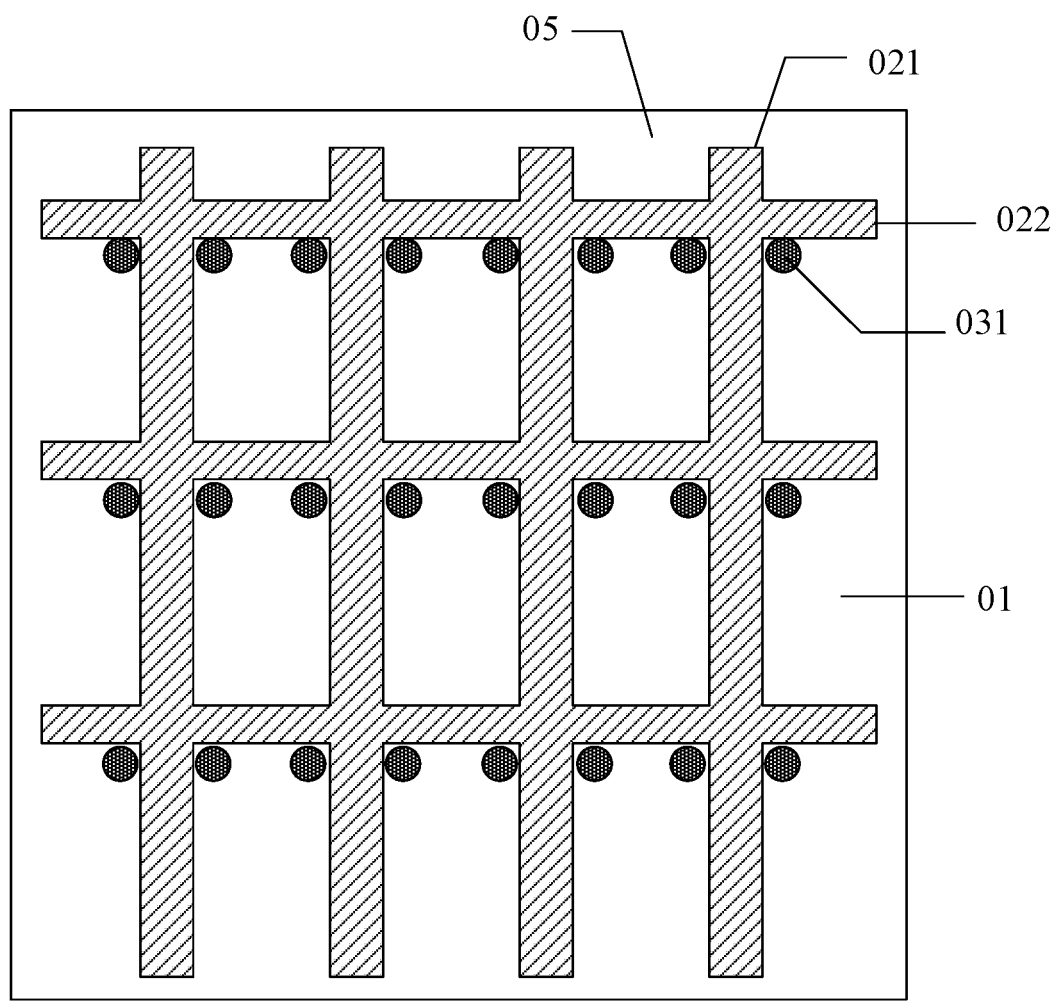

Step 7, as shown in FIG. 2G, an amorphous silicon film 05 covering the catalyst particles 031, the guide walls 021 and the retaining walls 022 is formed.

Figure 2H:
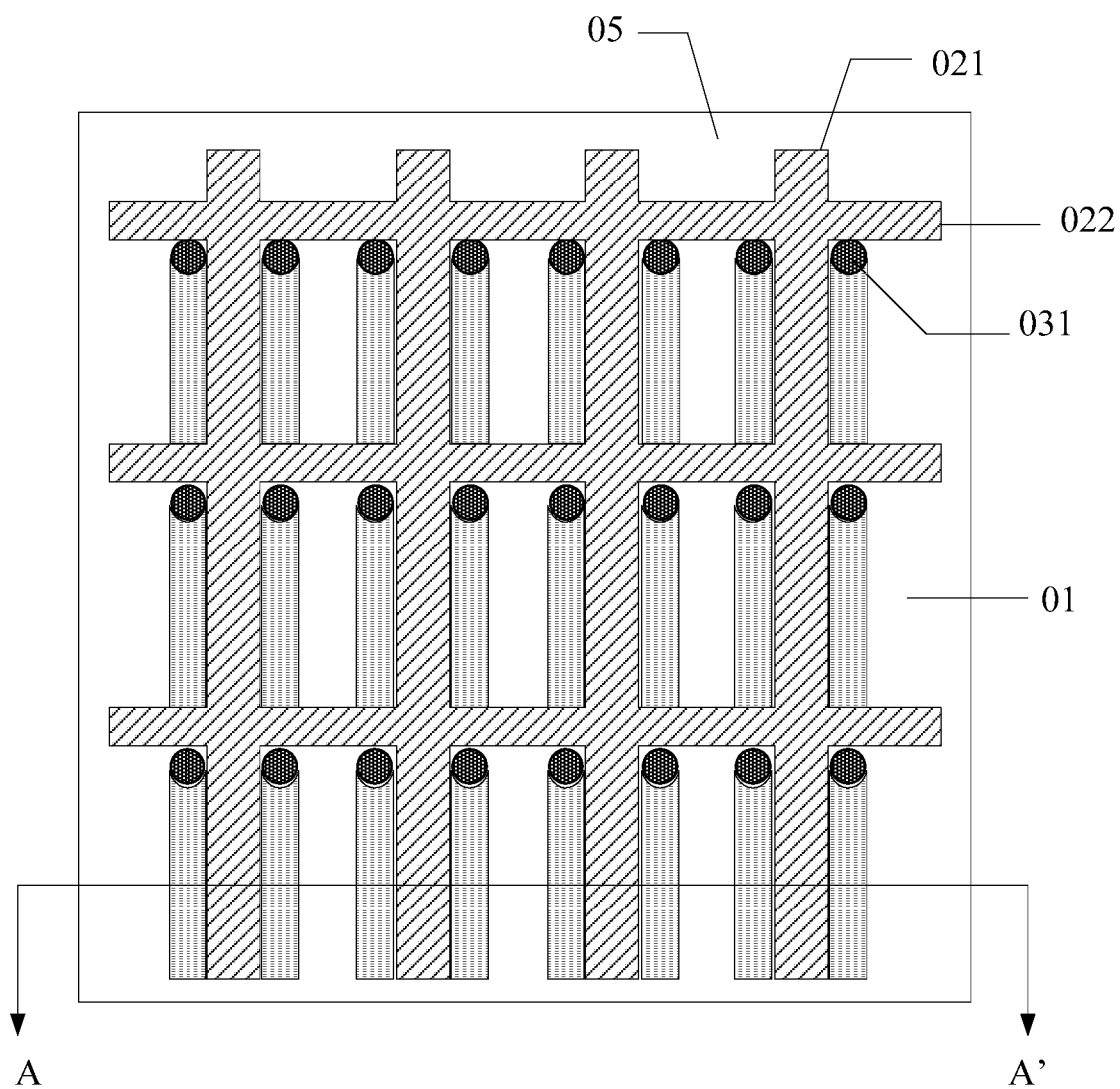
Figure 2I:
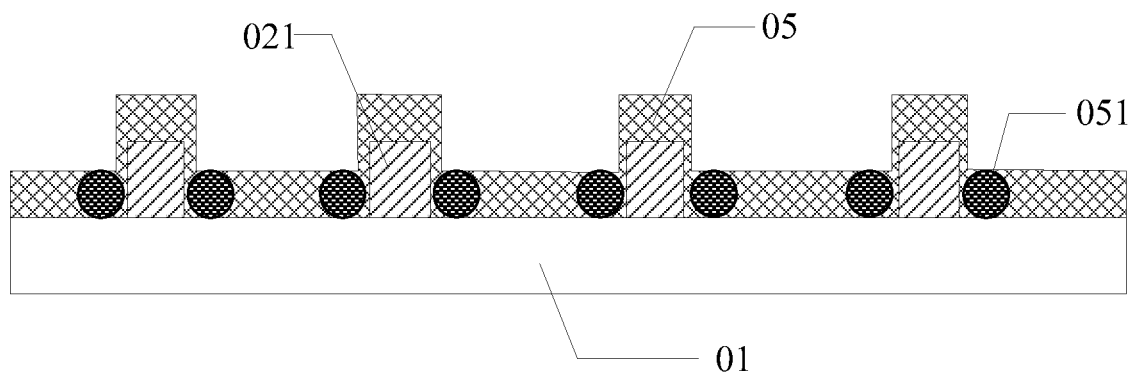
FIG. 2I is a sectional structural diagram along a direction AA' of FIG. 2H.

Step 8, as shown in FIGS. 2H and 2I, the amorphous silicon film 05 is annealed, so that the amorphous silicon grows from the catalyst particles 031 along the direction of the guide walls to form silicon-based nanowires 051.

In specific implementation, in annealing of the amorphous silicon film, an annealing temperature may be controlled between 200° C. and 600° C., which is not limited here.

In some other embodiments of the present disclosure, other steps are same as in the embodiment described above except steps 4, 5 and 6 which are different. Only the different steps are described in detail below.

Step 4', a photoresist is formed on the catalyst film layer.

Step 5', an exposure and developing process is performed on the photoresist to form a pattern of photoresist particles.

Step 6', the catalyst film layer is etched by using the pattern of the photoresist particles as a mask pattern, to form a pattern of catalyst particles.

In still some other embodiments of the present disclosure, the steps are the same as steps 1-4, and 7-8, except for steps 5 and 6, as compared to the above embodiments. Only the different steps are described in detail below.

Figure 3A:
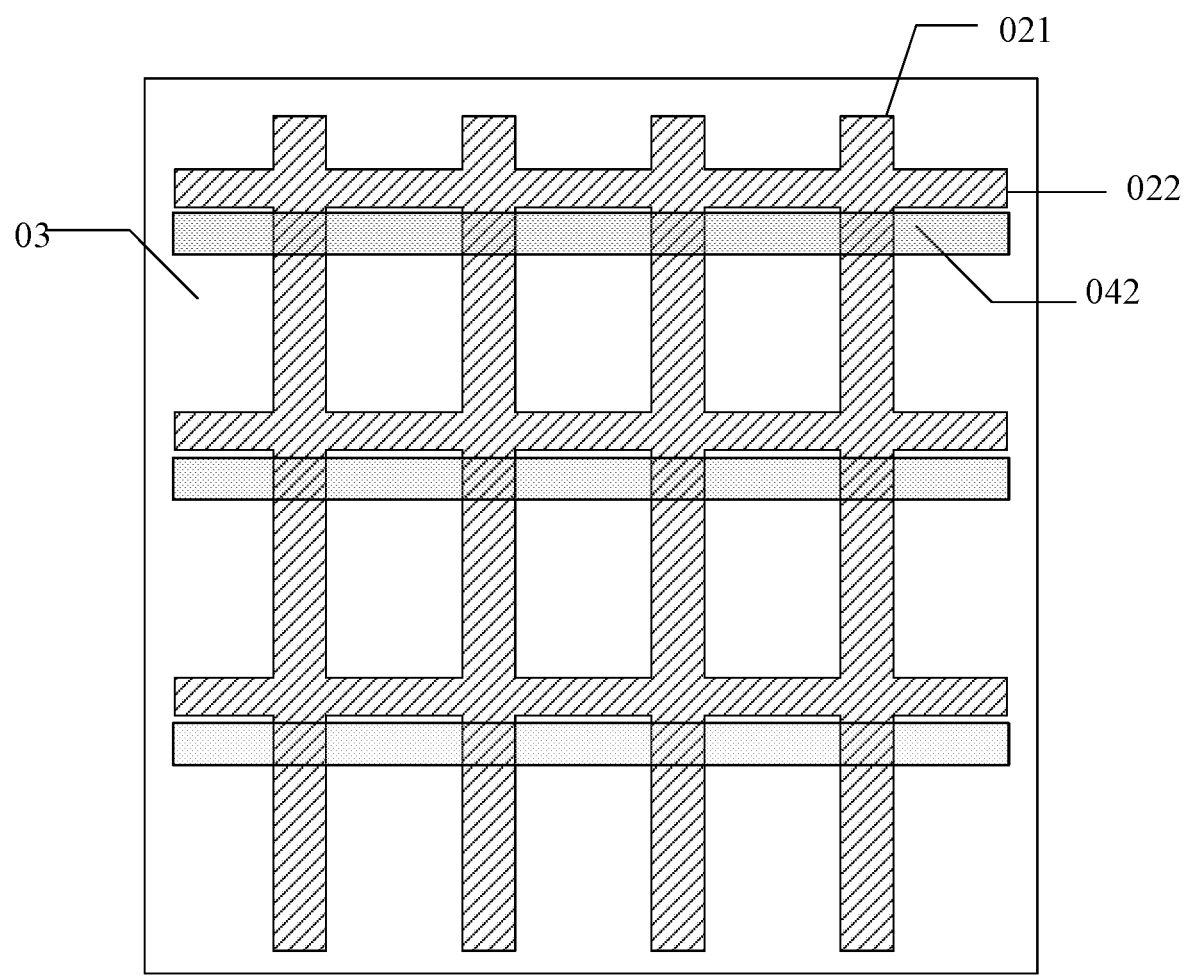
FIGS. 3A and 3B are respective schematic diagrams of structures corresponding to a preparation method provided by an embodiment of the present disclosure after respective steps are executed.

Step 5", as shown in FIG. 3A, a nanoimprint process is performed on the imprint resist 04 to form a pattern of imprint resist lines 042. An extending direction of the imprint resist lines 042 is same as an extending direction of the retaining walls 022.

Figure 3B:
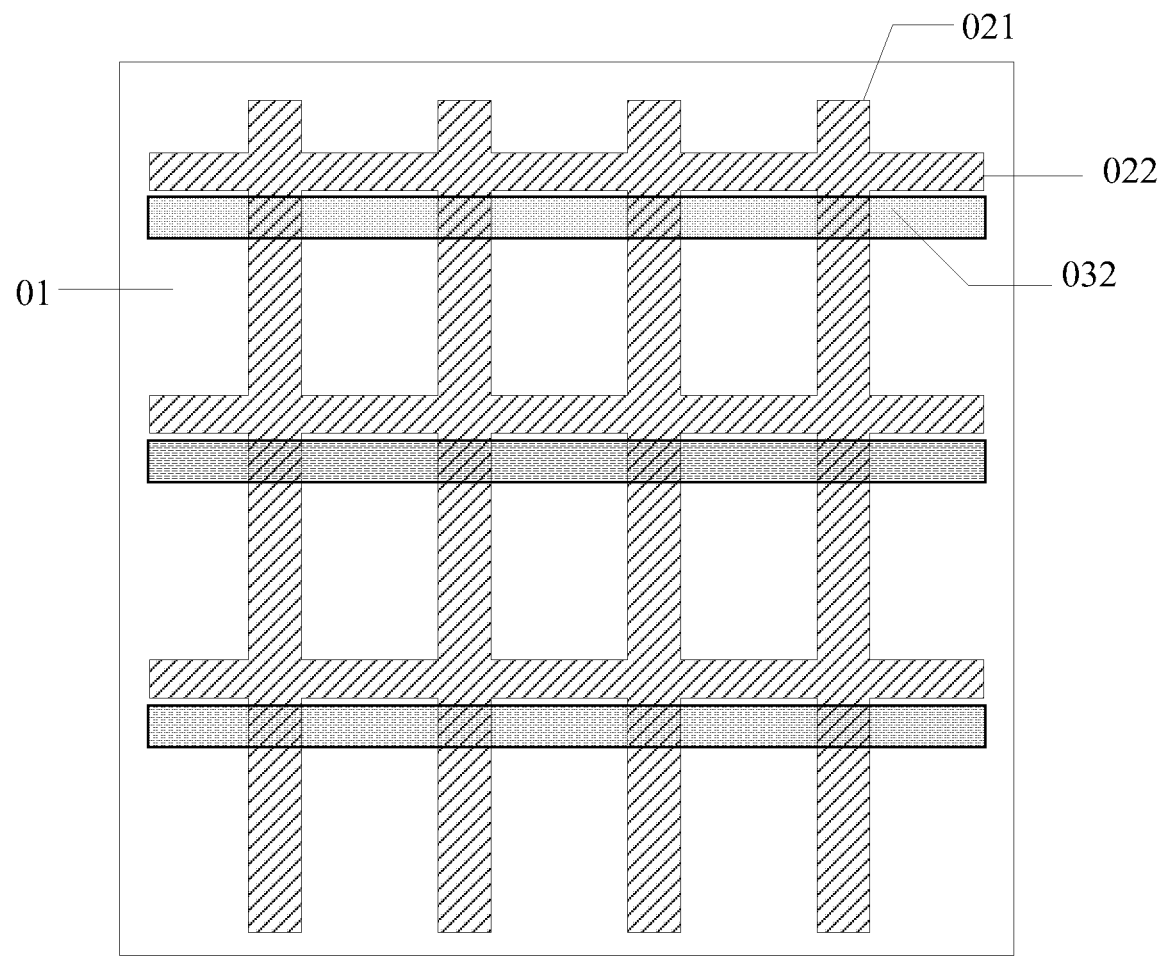

Step 6", as shown in FIG. 3B, the catalyst film layer 03 is etched by using the pattern of the imprint resist lines 042 as a mask pattern to form a pattern of catalyst lines 032.

Step 7", plasma bombardment is performed on the catalyst lines 032 to form a pattern of catalyst particles 031.

It should be noted that, in the above-mentioned preparation method provided by embodiments of the present disclosure, the patterning process may only include a photolithography process, or may include a photolithography process and an etching step, and may also include other processes for forming predetermined patters such as printing, and inkjet processes. And the photolithography process refers to a process for forming patterns by using a photoresist, a mask, an exposure machine and the like, including film formation, exposure, development and other process steps. In specific implementation, a corresponding patterning process may be selected according to the structure formed in the present disclosure.

Based on the same inventive concept, an embodiment of the present disclosure further provides a silicon-based nanowire, which is prepared by any of the above-mentioned preparation methods provided by embodiments of the present disclosure. As the problem-solving principle of the silicon-based nanowire is similar to that of the above-mentioned preparation method of a silicon-based nanowire, for the implementation of the silicon-based nanowire, reference may be made to the implementation of the above-mentioned and the preparation method of a silicon-based nanowire, and repeated description is omitted.

Based on the same inventive concept, an embodiment of the present disclosure further provides a thin film transistor, which includes a source, a drain, a gate and an active layer. The material of the active layer includes the above-mentioned silicon-based nanowire provided by an embodiment of the present disclosure. As the problem-solving principle of the thin film transistor is similar to that of the above-mentioned silicon-based nanowire, for the implementation of the thin film transistor, reference may be made to the implementation of the above-mentioned silicon-based nanowire, and repeated description is omitted here.

In specific implementation, in the case where the above-mentioned silicon-based nanowire provided by an embodiment of the present disclosure is used as the material of the active layer, the amorphous silicon film formed with the silicon-based nanowire needs to be patterned, so that the silicon-based nanowire is in an active layer area, and both the amorphous silicon and the silicon-based nanowire, or only the silicon-based nanowire may be selected to retain in the active layer area.

For the silicon-based nanowire, the method for preparing the silicon-based nanowire, and the thin film transistor provided by embodiments of the present disclosure, by using a eutectic point of the catalyst particles and silicon, and a driving factor that the Gibbs free energy of amorphous silicon is greater than that of crystalline silicon, and due to absorption of the amorphous silicon by the molten catalyst particles to form a supersaturated silicon eutectoid, the silicon nucleates and grows into silicon-based nanowires. Moreover, during the growth of the silicon-based nanowire, the amorphous silicon film grows linearly along guide walls under the action of the catalyst particles, and reverse growth of the silicon-based nanowire is restricted by the retaining walls, thus obtaining silicon-based nanowires with a high density and high uniformity. In addition, by controlling the size of the catalyst particles and the thickness of the amorphous silicon film, the width of the silicon-based nanowire may also be controlled.

Evidently, those skilled in the art can make various modifications and variations to the present disclosure without departing from the spirit and scope of the present disclosure. Thus, the present disclosure is also intended to encompass these modifications and variations thereto so long as the modifications and variations come into the scope of the claims appended to the present disclosure and their equivalents.

What is claimed is:

1. A method for preparing a silicon-based nanowire, comprising:
   forming catalyst particles, guide walls and retaining walls on a base substrate, wherein:
   the guide walls extend in a first direction;
   the retaining walls and the guide walls intersect and are located in a same layer; and
   the catalyst particles are located in areas defined by the retaining walls and the guide walls, and have a eutectic point with silicon;
   forming an amorphous silicon film covering the catalyst particles, the guide walls and the retaining walls; and
   forming silicon-based nanowires by annealing the amorphous silicon film to a growth of amorphous silicon from the catalyst particles and along the first direction.

2. The method of claim 1, wherein the forming the catalyst particles, the guide walls and the retaining walls on the base substrate comprises:
   forming a dielectric layer on the base substrate;
   forming a pattern of the guide walls and a pattern of the retaining walls by patterning the dielectric layer;
   forming a catalyst film layer on the base substrate formed with the pattern of the guide walls and the pattern of the retaining walls; and
   forming a pattern of the catalyst particles in the catalyst film layer.

3. The method of claim 2, wherein the forming the pattern of the catalyst particles in the catalyst film layer, comprises:
   forming an imprint resist on the catalyst film layer;
   forming a pattern of imprint resist particles by a nanoimprint process on the imprint resist; and
   forming the pattern of the catalyst particles by etching the catalyst film layer with the pattern of the imprint resist particles as a mask pattern.

4. The method of claim 2, wherein the forming the pattern of the catalyst particles in the catalyst film layer, comprises:
   forming an imprint resist on the catalyst film layer;
   forming a pattern of imprint resist lines by a nanoimprint process on the imprint resist, wherein an extending direction of the imprint resist lines equals to an extending direction of the retaining walls;
   form a pattern of catalyst lines by etching the catalyst film layer with the pattern of the imprint resist lines as a mask pattern; and
   forming the pattern of the catalyst particles by plasma bombardment on the catalyst lines;
   wherein a width of a catalyst line is in a range from 50 nm to 1000 nm.

5. The method of claim 2, wherein the forming the pattern of the catalyst particles in the catalyst film layer, comprises:
   forming a photoresist on the catalyst film layer;
   forming a pattern of photoresist particles by an exposure and developing process of the photoresist; and
   forming the pattern of the catalyst particles by etching the catalyst film layer with the pattern of the photoresist particles as a mask pattern.

6. The method of claim 1, wherein the forming the catalyst particles, the guide walls and the retaining walls on the base substrate, comprises:
   forming a catalyst film layer on the base substrate;
   forming a pattern of the catalyst particles in the catalyst film layer;
   forming a dielectric layer on the base substrate formed with the pattern of the catalyst particles; and
   forming a pattern of the guide walls and a pattern of the retaining walls by patterning the dielectric layer.

7. The method of claim 6, wherein the forming the pattern of the catalyst particles in the catalyst film layer, comprises:
   forming an imprint resist on the catalyst film layer;
   forming a pattern of imprint resist particles by a nanoimprint process on the imprint resist; and
   forming the pattern of the catalyst particles by etching the catalyst film layer with the pattern of the imprint resist particles as a mask pattern.

8. The method of claim 6, wherein the forming the pattern of the catalyst particles in the catalyst film layer, comprises:
   forming an imprint resist on the catalyst film layer;
   forming a pattern of imprint resist lines by a nanoimprint process on the imprint resist, wherein an extending direction of the imprint resist lines equals to an extending direction of the retaining walls;
   form a pattern of catalyst lines by etching the catalyst film layer with the pattern of the imprint resist lines as a mask pattern; and
   forming the pattern of the catalyst particles by plasma bombardment on the catalyst lines.

9. The method of claim 8, wherein a width of a catalyst line is in a range from 50 nm to 1000 nm.

10. The method of claim 6, wherein the forming the pattern of the catalyst particles in the catalyst film layer, comprises:
    forming a photoresist on the catalyst film layer;
    forming a pattern of photoresist particles by an exposure and developing process of the photoresist; and
    forming the pattern of the catalyst particles by etching the catalyst film layer with the pattern of the photoresist particles as a mask pattern.

11. The method of claim 1, wherein a material of the catalyst particles is indium, tin, nickel, or indium oxide.

12. The method of claim 1, wherein heights of the guide walls and heights of the retaining walls are greater than or equal to particle diameters of the catalyst particles.

13. The method of claim 1, wherein particle diameters of the catalyst particles are in a range from 1 nm to 5000 nm.

14. The method of claim 1, wherein heights of the guide walls are in a range from 5 nm to 5000 nm, and heights of the retaining walls are in a range from 5 nm to 5000 nm.

15. The method of claim 1, wherein the eutectic point of the catalyst particles and silicon is within a temperature range from 200° C. to 1000° C.; and
    an annealing temperature is in a range from 200° C. to 600° C. in the annealing of the amorphous silicon film.

16. The method of claim 1, comprising:
    forming the catalyst particles close to the retaining walls.

17. The method of claim 16, wherein within an area defined by the retaining walls and the guide walls, the catalyst particles are in contact with a same retaining wall, and at least part of the catalyst particles is in contact with at least one guide wall.

18. The method of claim 1, wherein within each area defined by the retaining walls and the guide walls, one or more of the catalyst particles are formed.

* * * * *